United States Patent
Weaver, Jr.

(10) Patent No.: US 7,260,939 B2
(45) Date of Patent: Aug. 28, 2007

(54) THERMAL TRANSFER DEVICE AND SYSTEM AND METHOD INCORPORATING SAME

(75) Inventor: Stanton Earl Weaver, Jr., Northville, NY (US)

(73) Assignee: General Electric Company, Niskayuna, NY (US)

( * ) Notice: Subject to any disclaimer, the term of this patent is extended or adjusted under 35 U.S.C. 154(b) by 364 days.

(21) Appl. No.: 11/015,260

(22) Filed: Dec. 17, 2004

(65) Prior Publication Data

US 2006/0130489 A1  Jun. 22, 2006

(51) Int. Cl.
- F25B 21/00  (2006.01)
- H01L 35/30  (2006.01)
- H01L 29/36  (2006.01)
- H01L 29/74  (2006.01)
- H01J 1/00   (2006.01)

(52) U.S. Cl. .................... 62/3.1; 136/205; 257/109; 313/311

(58) Field of Classification Search ............ 62/3.1; 310/306, 301; 136/205; 257/109, 613; 313/311; 423/447.1
See application file for complete search history.

(56) References Cited

U.S. PATENT DOCUMENTS

| | | | |
|---|---|---|---|
| 3,169,200 A | 2/1965 | Huffman | 310/4 |
| 3,702,408 A | 11/1972 | Longsderff et al. | 310/4 |
| 4,039,352 A | 8/1977 | Marinesu | 136/205 |
| 4,492,809 A | 1/1985 | Dahlberg | 136/212 |
| 4,667,126 A | 5/1987 | Fitzpatrick | 310/306 |
| 4,755,350 A | 7/1988 | Kennel | 376/321 |
| 5,028,835 A | 7/1991 | Fitzpatrick | 313/14 |
| 5,219,516 A | 6/1993 | Horner-Richardson et al. | 376/321 |

(Continued)

FOREIGN PATENT DOCUMENTS

EP  0706196 B1  3/2000

(Continued)

OTHER PUBLICATIONS

Vu Thien Binh and Ch. Adessi; New Mechanism for Electron Emission from Planar Cold Cathodes: The Solid-State Field-Controlled Electron Emitter; vol. 85, No. 4; pp. 864-867; Jul. 24, 2000.

*Primary Examiner*—William C Doerrler
(74) *Attorney, Agent, or Firm*—Fletcher Yoder

(57) ABSTRACT

A method of manufacturing a thermal transfer device including providing first and second thermally conductive substrates that are substantially atomically flat, providing a patterned electrical barrier having a plurality of closed shapes on the first thermally conductive substrate and providing a nanotube catalyst material on the first thermally conductive substrate in a nanotube growth area oriented within each of the plurality of closed shapes of the patterned electrical barrier. The method also includes orienting the second thermally conductive substrate opposite the first thermally conductive substrate such that the patterned electrical barrier is disposed between the first and second thermally conductive substrates and providing a precursor gas proximate the nanotube catalyst material to facilitate growth of nanotubes in the nanotube growth areas from the first thermally conductive substrate toward, and limited by, the second thermally conductive substrate. In this thermal transfer device, introduction of current flow between the first and second thermally conductive substrates enables heat transfer between the first and second thermally conductive substrates via a flow of electrons between the first and second thermally conductive substrates.

22 Claims, 7 Drawing Sheets

U.S. PATENT DOCUMENTS

| | | |
|---|---|---|
| 5,492,570 A | 2/1996 | Horner-Richardson et al. .................. 136/200 |
| 5,541,464 A | 7/1996 | Johnson et al. ............. 310/306 |
| 5,637,946 A | 6/1997 | Bushman .................... 310/306 |
| 5,675,972 A | 10/1997 | Edelson ........................ 62/3.1 |
| 5,973,259 A | 10/1999 | Edelson ...................... 136/254 |
| 5,994,638 A | 11/1999 | Edelson ...................... 136/205 |
| 6,037,697 A | 3/2000 | Begg et al. .................. 310/306 |
| 6,064,137 A | 5/2000 | Cox ............................. 310/306 |
| 6,084,173 A | 7/2000 | DiMatteo .................... 136/201 |
| 6,100,621 A | 8/2000 | Rasor et al. ................. 310/306 |
| 6,229,083 B1 | 5/2001 | Edelson ....................... 136/201 |
| 6,232,546 B1 | 5/2001 | DiMatteo et al. ........... 136/253 |
| 6,281,514 B1 | 8/2001 | Tavkhelidze ............. 250/493.1 |
| 6,294,858 B1 | 9/2001 | King et al. ................. 310/306 |
| 6,384,312 B1 | 5/2002 | Ghoshal et al. ............. 136/203 |
| 6,396,191 B1 | 5/2002 | Hagelstein et al. ......... 310/306 |
| 6,407,477 B1 | 6/2002 | King et al. ................. 310/306 |
| 6,417,060 B2 | 7/2002 | Tavkhelidze et al. ....... 438/380 |
| 6,467,275 B1 | 10/2002 | Ghoshal ...................... 62/3.7 |
| 6,489,704 B1 * | 12/2002 | Kucherov et al. .......... 310/306 |
| 6,494,048 B1 | 12/2002 | Ghoshal et al. .............. 62/3.7 |
| 6,495,843 B1 | 12/2002 | Tavkelidze ............... 250/493.1 |
| 6,509,669 B1 | 1/2003 | King et al. ................. 310/306 |
| 6,531,703 B1 | 3/2003 | Tavkhelidze ............. 250/493.1 |
| 6,608,250 B2 | 8/2003 | Ghoshal ...................... 136/201 |
| 6,625,990 B2 | 9/2003 | Bell ............................. 62/3.3 |
| 6,651,760 B2 | 11/2003 | Cox et al. .................. 180/65.3 |
| 6,720,704 B1 | 4/2004 | Tavkhelidze et al. ....... 310/306 |
| 6,906,449 B2 * | 6/2005 | Kucherov et al. .......... 310/306 |
| 6,918,284 B2 * | 7/2005 | Snow et al. ................ 73/31.05 |
| 6,949,873 B2 * | 9/2005 | Sung ........................... 313/311 |
| 7,038,299 B2 * | 5/2006 | Furukawa et al. .......... 257/613 |
| 2001/0046749 A1 | 11/2001 | Tavkhelidze et al. ....... 438/380 |
| 2002/0166839 A1 | 11/2002 | Ghoshal et al. ............... 216/11 |
| 2002/0170172 A1 | 11/2002 | Tavkhelidze et al. ......... 29/842 |
| 2003/0033818 A1 | 2/2003 | Kucherov et al. .......... 136/204 |
| 2003/0042819 A1 | 3/2003 | Martinovsky et al. ...... 310/306 |
| 2003/0068431 A1 | 4/2003 | Taliashvili et al. ............ 427/58 |
| 2003/0184188 A1 | 10/2003 | Kucherov et al. .......... 310/306 |
| 2004/0029341 A1 | 2/2004 | Cox et al. .................... 438/237 |
| 2004/0031514 A1 | 2/2004 | Bell ............................ 136/203 |
| 2004/0050415 A1 | 3/2004 | Kucherov et al. .......... 136/252 |
| 2005/0112049 A1 * | 5/2005 | Hofmeister ............... 423/447.1 |
| 2006/0124958 A1 * | 6/2006 | Cox et al. .................... 257/109 |

FOREIGN PATENT DOCUMENTS

| | | |
|---|---|---|
| WO | WO9913562 A1 | 3/1999 |
| WO | WO9940628 A1 | 8/1999 |
| WO | WO0059047 A1 | 10/2000 |
| WO | WO0139235 A2 | 5/2001 |
| WO | WO0169657 A2 | 9/2001 |
| WO | WO03021663 A1 | 3/2003 |
| WO | WO03021758 A2 | 3/2003 |
| WO | WO03083177 A2 | 10/2003 |
| WO | WO03090245 A1 | 10/2003 |
| WO | WO2004036724 A2 | 4/2004 |

* cited by examiner

THERMAL TRANSFER DEVICE AND SYSTEM AND METHOD INCORPORATING SAME

BACKGROUND

The invention relates generally to thermal transfer devices, and particularly, to solid-state thermal transfer devices.

Thermal transfer devices may be used for a variety of heating/cooling and power generation/heat recovery systems, such as refrigeration, air conditioning, electronics cooling, industrial temperature control, waste heat recovery, and power generation. These thermal transfer devices are also scalable to meet the thermal management needs of a particular system and environment. Unfortunately, existing thermal transfer devices, such as those relying on refrigeration cycles, are relatively inefficient and environmentally unfriendly due to mechanical components such as compressors and the use of refrigerants.

In contrast, solid-state thermal transfer devices offer certain advantages, such as the potential for higher efficiencies, reduced size and weight, reduced noise, and being more environmentally friendly. For example, thermotunneling devices transfer heat by tunneling hot electrons from one electrode to another electrode across a nanometer-scale barrier. The heat transfer efficiency of these thermotunneling devices depends upon various factors, such as material characteristics (e.g., electrodes and barrier), electrode alignment, electrode spacing, and thermal losses. For example, the efficiency of these thermotunneling devices generally improves if the electrodes have a low work function, the barrier is in vacuum or an inert gas, and the spacing between the electrodes is less than about 50 nanometers. Unfortunately, electrode spacing is particularly difficult to achieve and maintain in these thermotunneling devices. Thus, achieving efficient thermotunneling devices can be problematic.

Accordingly, a need exists for creating a thermal transfer device with low work function electrodes and a controlled spacing between the electrodes.

BRIEF DESCRIPTION

In accordance with certain embodiments, a method of manufacturing a thermal transfer device includes providing first and second thermally conductive substrates that are substantially atomically flat, providing a patterned electrical barrier having a plurality of closed shapes on the first thermally conductive substrate, and providing a nanotube catalyst material on the first thermally conductive substrate in a nanotube growth area oriented within each of the plurality of closed shapes of the patterned electrical barrier. The method also includes orienting the second thermally conductive substrate opposite the first thermally conductive substrate such that the patterned electrical barrier is disposed between the first and second thermally conductive substrates and providing a precursor gas proximate the nanotube catalyst material to facilitate growth of nanotubes in the nanotube growth areas from the first thermally conductive substrate toward, and limited by, the second thermally conductive substrate. In this thermal transfer device, introduction of current flow between the first and second thermally conductive substrates enables heat transfer between the first and second thermally conductive substrates via a flow of electrons between the first and second thermally conductive substrates.

In accordance with certain embodiments, the present technique has a thermal transfer device including first and second thermally conductive substrates that are positioned opposite from one another, wherein the first and second thermally conductive substrates are each substantially atomically flat. The thermal transfer device also includes a patterned electrical barrier having a plurality of closed shapes disposed on the first thermally conductive substrate. The thermal transfer device further includes a plurality of nanotubes grown in a nanotube growth area oriented within each of the plurality of closed shapes of the patterned electrical barrier, wherein a grown dimension of the nanotubes is limited by growth areas from the first thermally conductive substrate toward, and limited by, the second thermally conductive substrate. In this thermal transfer device, introduction of current flow between the first and second thermally conductive substrates enables heat transfer between the first and second thermally conductive substrates via a flow of electrons between the first and second thermally conductive substrates.

In accordance with certain embodiments, the present technique has a method of operation of a thermal transfer device including passing hot electrons across a thermotunneling gap between first and second thermally conductive substrates, wherein the thermotunneling gap is defined by nanotubes oriented between a patterned electrical barrier on the first or second thermally conductive substrate.

DRAWINGS

These and other features, aspects, and advantages of the present invention will become better understood when the following detailed description is read with reference to the accompanying drawings in which like characters represent like parts throughout the drawings, wherein.

Figure 10:
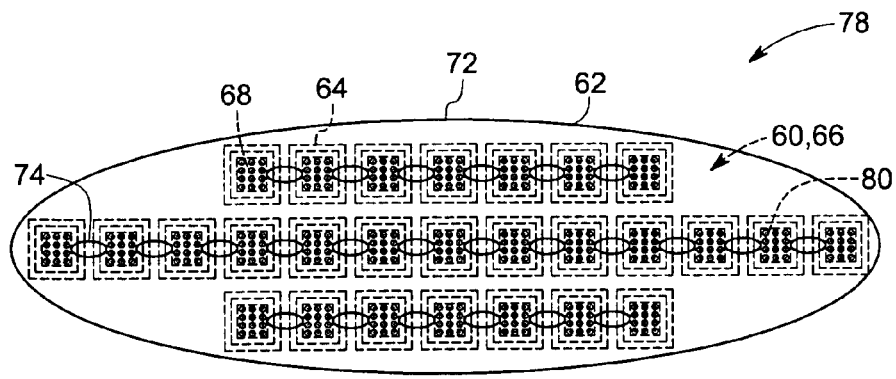
FIG. 10 is a diagrammatical illustration of the assembly of FIG. 9 having nanotubes grown in a self-limiting manner between the substrates in the region of the nanotube catalyst material of FIG. 7 between the patterned electrical barrier of FIG. 6 for use in a thermal transfer device in accordance with embodiments of the present technique.
Figure 11:
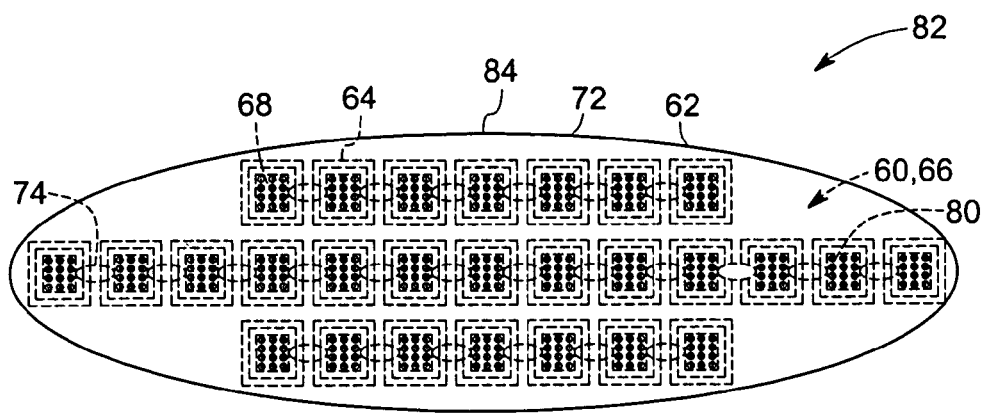
FIG. 11 is a diagrammatical top view illustrating the assembly of FIG. 10 having another substrate disposed sealingly over the gaseous vent holes of FIG. 8 for use in a thermal transfer device in accordance with embodiments of the present technique.
Figure 12:
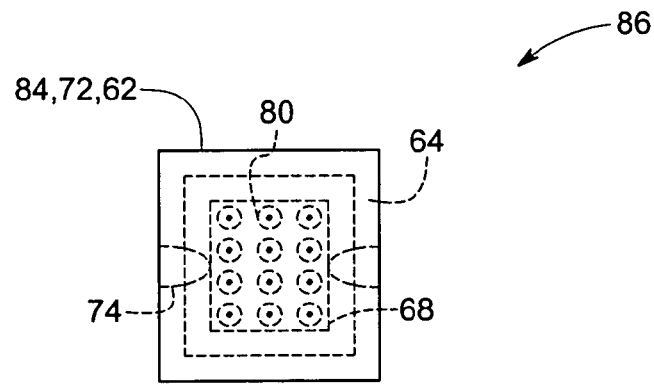
FIG. 12 is a diagrammatical top view illustrating a thermal transfer unit extracted from the assembly of FIGS. 10 or 11 in accordance with embodiments of the present technique.
Figure 13:
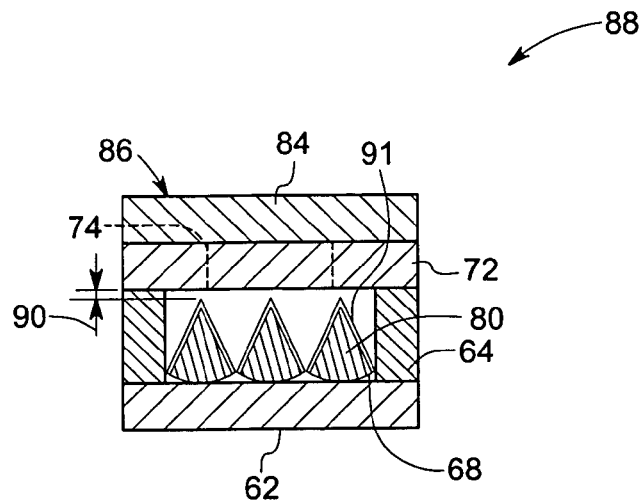
FIG. 13 is a diagrammatical side view illustrating an assembled block of a thermal transfer device having a thermotunneling gap in accordance with embodiments of the present technique.
Figure 14:
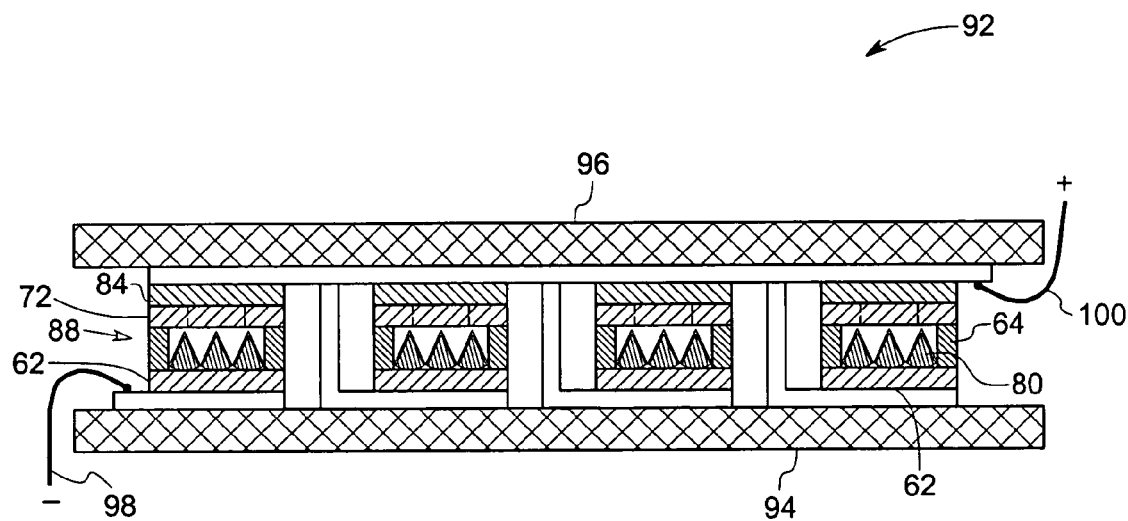
Figure 15:
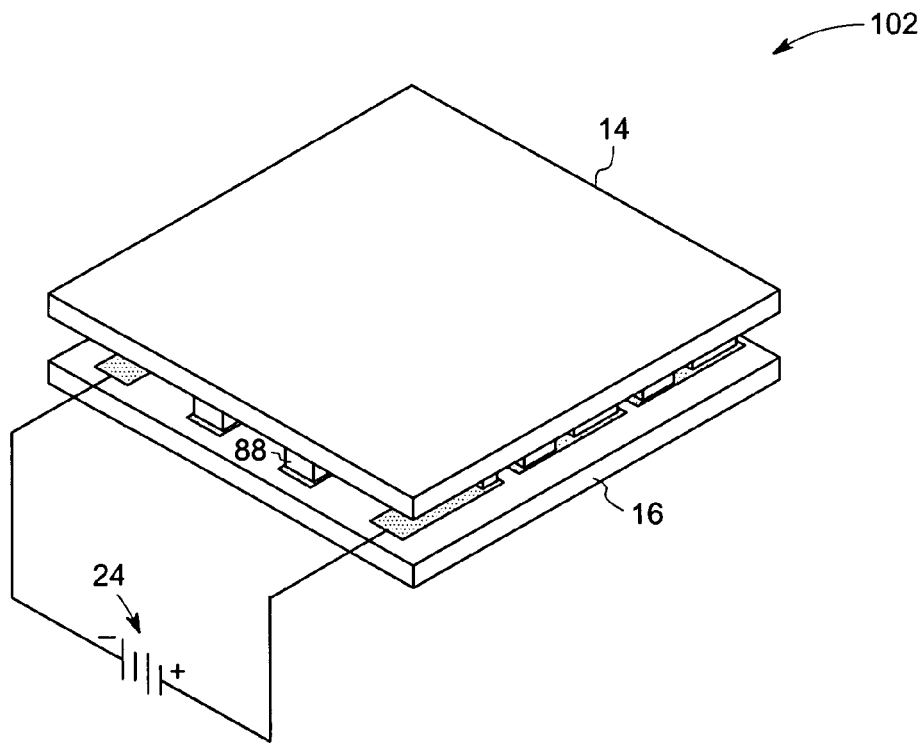

FIG. 14 is a diagrammatical side view illustrating an assembled module of a thermal transfer device having a plurality of thermal transfer units as illustrated in FIGS. 12 and 13 extracted from the assembly of FIG. 10 or 11 in accordance with embodiments of the present technique; and FIG. 15 is a perspective view illustrating a module having an array of thermal transfer devices in accordance with embodiments of the present technique.

DETAILED DESCRIPTION

Figure 1:
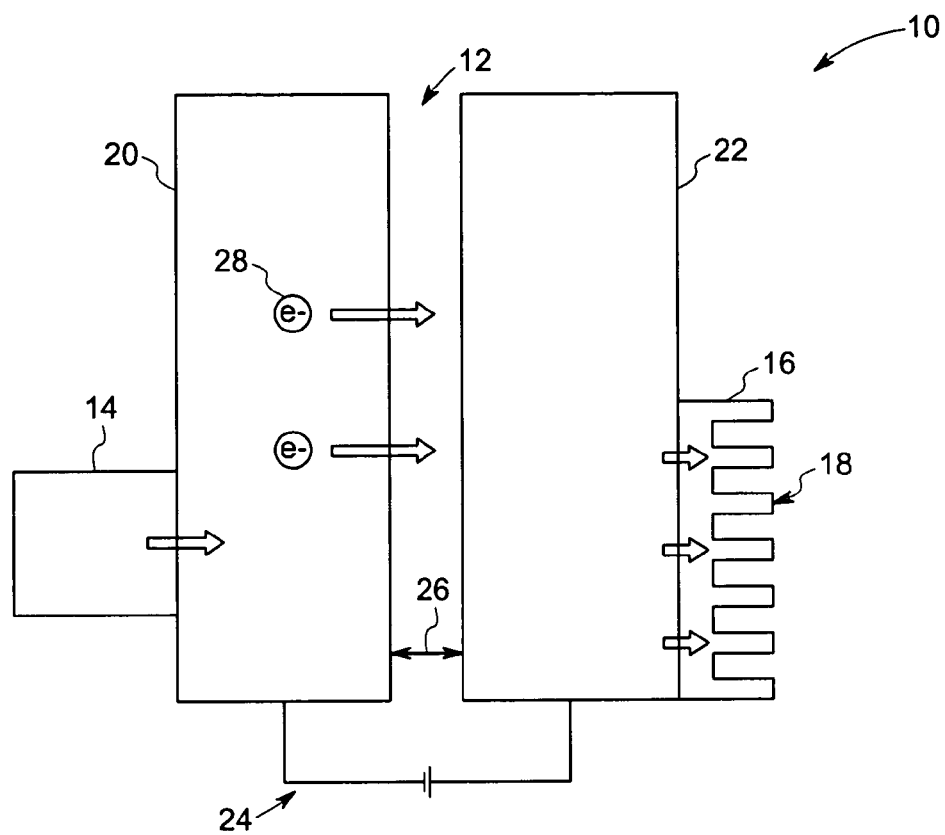
FIG. 1 is a diagrammatical illustration of a system having a thermal transfer device in accordance with embodiments of the present technique.

Referring now to the drawings, FIG. 1 illustrates a system 10 having a thermotunneling-based thermal transfer device in accordance with certain embodiments of the present technique. As illustrated, the system 10 includes a thermotunneling device 12 that transfers heat from an area or object 14 to another area or object, such as a heat sink 16, which heat sink 16 then dissipates the heat via fins 18. More specifically, the thermotunneling device 12 comprises a first electrode 20 thermally coupled to the object 14 and a second electrode 22 that is thermally coupled to the heat sink 16. Further, an input voltage source 24 is coupled to the first electrode 20 and the second electrode 22, which electrodes 20 and 22 are separated by a thermotunneling gap 26. In operation, the input voltage source 24 provides a flow of current through the first and second electrodes 20 and 22, thereby creating a tunneling flow of hot electrons 28 between the electrodes 20 and 22 across the thermotunneling gap 26. In this embodiment, the flow of current via the input voltage source 24 enables hot electrons 28 to leave their orbit and tunnel across the thermotunneling gap 26, thus transporting heat. As a result of this tunneling flow of hot electrons 28, the thermotunneling device 12 facilitates heat transfer away from the object 14 towards the heat sink 16. At the heat sink 16, the fins 18 facilitate heat transfer away from the system 10.

In this embodiment, the thermotunneling gap 26 is formed by vacuum that provides a minimum thermal back path to enhance the efficiency of the thermotunneling device 12. In certain embodiments, the thermotunneling gap 26 has a spacing ranging between approximately 4 nanometers to about 20 nanometers. The nanometer gap between the first and second electrodes 20 and 22 facilitates a substantial reduction in the tunneling of cold electrons across the thermotunneling gap and facilitates a substantial increase in the tunneling of hot electrons across the thermotunneling gap 26. Further, the nanometer gap between the first and second electrodes 20 and 22 advantageously reduces a high voltage requirement across the first and second electrodes 20 and 22 for facilitating the tunneling of electrons. Thus, a nanometer gap between the first and second electrodes 20 and 22 enables the tunneling of electrons at a relatively lower voltage, thereby enhancing the efficiency of the thermotunneling device 12.

The nanometer spacing and a bias voltage across the thermotunneling gap 26 ensure that the heat flow is substantially unidirectional. In the illustrated embodiment, the heat flow is unidirectional from the object 14 towards the heat sink 16, thus making the object 14 cooler by transferring the heat to the heat sink 16. In certain embodiments, the thermotunneling device 12 may facilitate the heating or cooling of a closed environment. It should be noted that the thermotunneling device 12 may be operable at or near room temperature. In certain embodiments, the first and second electrodes 20 and 22 comprise dissimilar materials that enhance the tunneling of electrons because of a peltier effect, thereby enhancing the efficiency of the thermotunneling device 12. However, the direction of current flow may be selected based upon a desired direction of the thermotunneling of electrons between the first and second electrodes 20 and 22.

Figure 2:
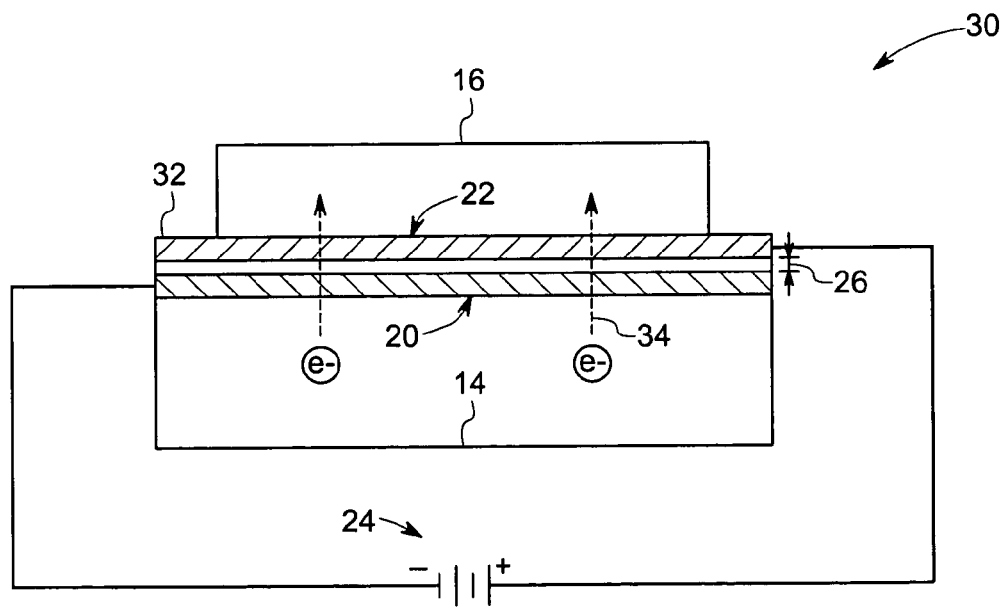
FIG. 2 is a diagrammatical illustration of a cooling system having a thermal transfer device in accordance with embodiments of the present technique.

FIG. 2 illustrates a cooling system 30 having a thermal transfer device, such as a thermotunneling device 32, in accordance with embodiments of the present technique. The thermotunneling device 32 comprises the first electrode 20 and the second electrode 22 separated by the thermotunneling gap 26. As illustrated, the first electrode 20 is thermally coupled to the object/area 14 and the second electrode 22 is thermally coupled to the object/area 16. Further, the first electrode 20 and the second electrode 22 are coupled to the input voltage source 24 with the polarity as shown in FIG. 2. In operation, the input voltage source 24 activates the thermotunneling device 32 at a pre-determined tunneling current. As the current flows from the first electrode 20 to the second electrode 22, the thermotunneling device 32 forces electrons to move from the object 14 toward the object 16 in a direction 34 over the thermotunneling gap 26. The movement of electrons in the direction 34 transfers heat away from the object 14, across the gap 26, and into the object 16, wherein the heat is further transferred away from the system 30. Advantageously, this thermotunneling-based heat transfer cools the object 14.

Figure 3:
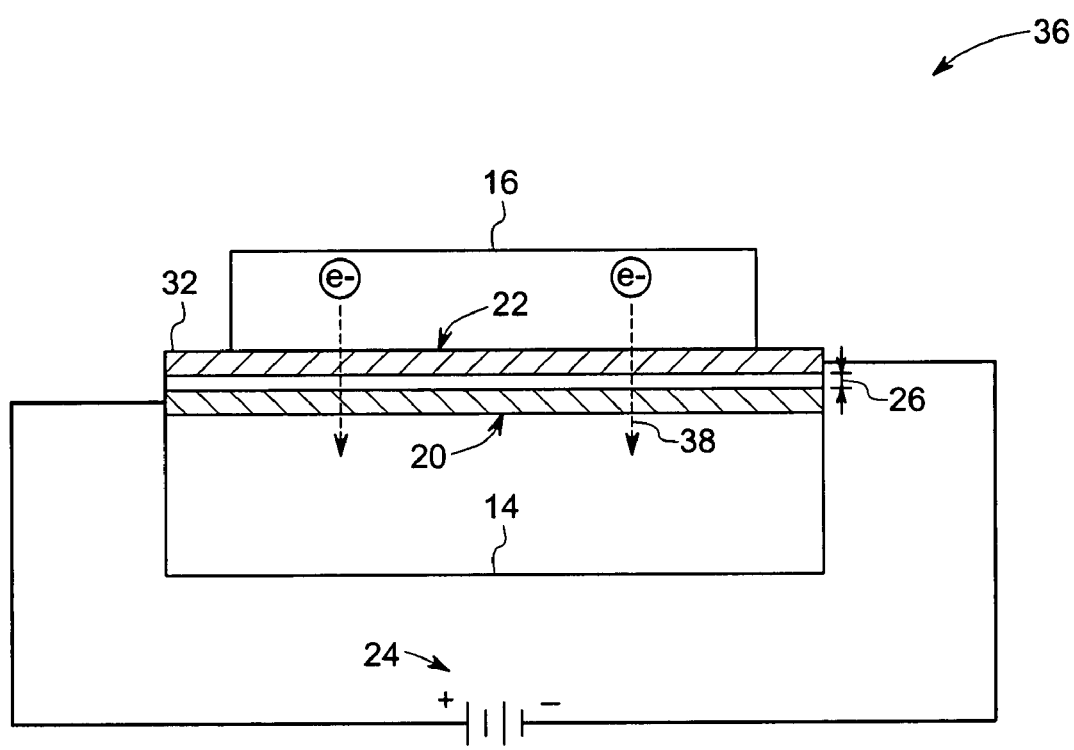
FIG. 3 is a diagrammatical illustration of a heating system having a thermal transfer device in accordance with embodiments of the present technique.

FIG. 3 illustrates a heating system 36 having the thermotunneling device 32 in accordance with embodiments of the present technique. As described above, the thermotunneling device 32 includes the two electrodes 20 and 22 that are thermally coupled to the objects 14 and 16, respectively. In addition, the thermotunneling device 32 is coupled to the input voltage source 24. As illustrated, the polarity of the input voltage source 24 in the heating system 36 is reversed as compared to the cooling system 30 as shown in FIG. 2. This enables the electrons to flow from the object 16 to the object 14 in a direction 38, thus heating the object 14 by transferring heat from the object 16 to the object 14. As described above, the thermotunneling device 32 may be employed for heating or cooling of objects 14 and 16. In certain embodiments, the thermotunneling device 32 may be employed for power generation by maintaining a temperature gradient between the first and second objects 14 and 16, respectively. The thermotunneling device 32 as described above may be fabricated by a variety of techniques, such as the exemplary techniques described in detail below with reference to FIGS. 4 and 5.

Figure 4:
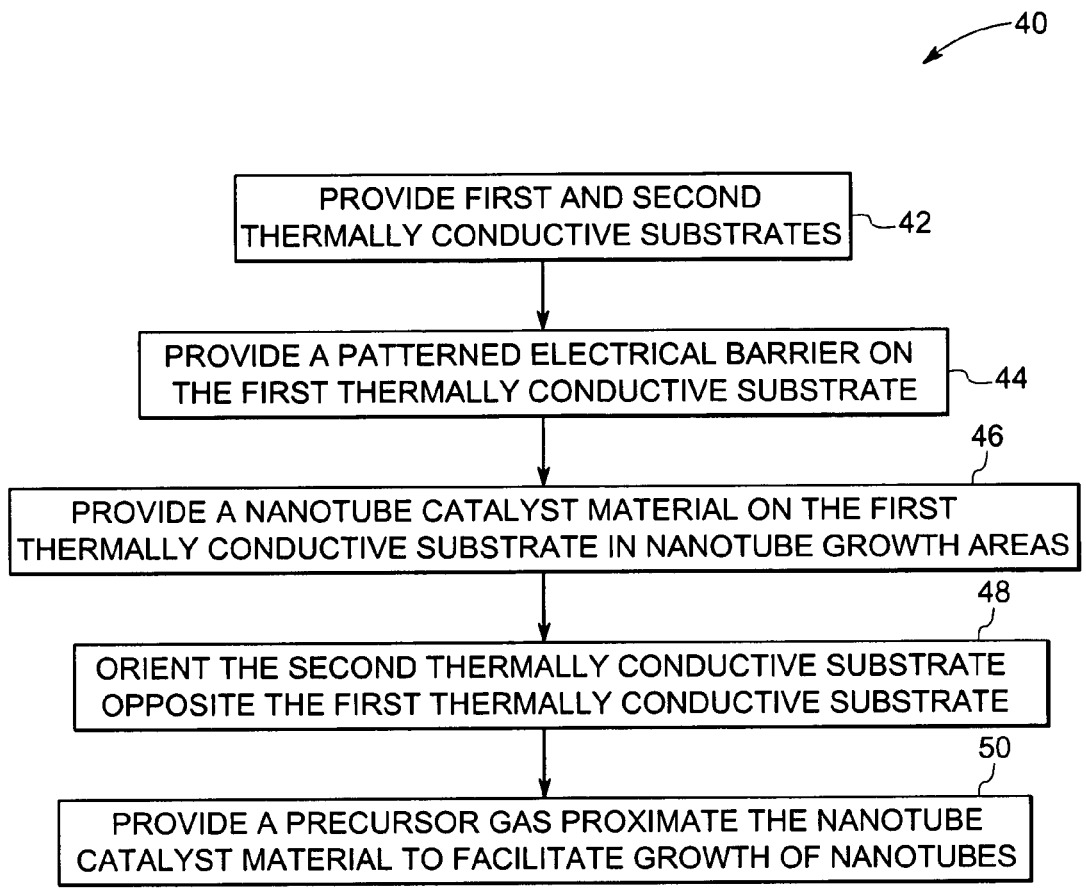
FIG. 4 is a flow chart illustrating a method of manufacturing a thermal transfer device in accordance with an embodiment of the present technique.

Referring first to FIG. 4, a flow chart illustrates an exemplary process 40 for manufacturing the thermotunneling device 32 of FIGS. 1, 2 and 3 in accordance with embodiments of the present technique. The process 40 begins by providing first and second thermally conductive substrates (block 42). In this embodiment, the first and second thermally conductive substrates comprise substantially atomically flat materials or structures. In other words, the structures (or surfaces of the structures) of the first and second thermally conductive substrates are each substantially flat to an atomic level. Advantageously, this substantially atomically flat characteristic of the substrates results in a relatively low emissivity. In certain embodiments, the emissivity of the first and second thermally conductive substrates is less than about 0.05. For example, highly doped n-type silicon wafers may be used for the first and second thermally conductive substrates. Alternatively, highly doped p-type silicon wafers may be used for the first and second thermally conductive substrates. In certain embodiments, the first and second thermally conductive substrates comprise an electrically insulating substrate having an electrically conductive coating disposed on the electrically insulating substrate. In some other embodiments, highly polished thermally and electrically conductive metals may be employed for the first and second thermally conductive substrates. Examples of such metals include aluminum, copper, nickel, and alloys thereof.

At block 44, the process 40 continues by providing a patterned electrical barrier having a plurality of closed shapes or borders on the first thermally conductive substrate. The patterned electrical barrier provides perimeter support to open areas on the first thermally conductive substrate. The patterned electrical barrier also facilitates control of alignment of the first and second thermally conductive substrates during subsequent bonding of the first and second thermally conductive substrates. In one embodiment, reference marks are provided on each of the first and second thermally conductive substrates that are employed by wafer bonder alignment optics to facilitate control of alignment of the first and second thermally conductive substrates. The bonding of the first and second thermally conductive substrates will be described in detail below. The thickness of the patterned electrical barrier is adjusted to a pre-determined value based upon a desired thermal isolation between the first and second thermally conductive substrates and a length at which nanotubes can be grown. It should be noted that, as used herein, the term "work function" is defined by the least amount of energy required to remove an electron from the surface of a solid material to a point outside the solid material. In certain embodiments, the thickness of the patterned electrical barrier is about 0.5 microns to about 2.0 microns. The patterned electrical barrier may be grown or deposited on the first thermally conductive substrate by techniques such as thermal oxidation, chemical vapor deposition, enhanced plasma assisted chemical vapor deposition, sputtering, evaporation and spin coating. In certain embodiments, the patterned electrical barrier comprises a material having a low thermal conductivity. Examples of such materials include oxides, polymers, nitrides, and silica-based aerogels.

Next, a nanotube catalyst material is provided in nanotube growth areas located on the first thermally conductive substrate (block 46). In this embodiment, the nanotube growth areas are oriented within each of the plurality of closed shapes of the patterned electrical barrier. In certain embodiments, the nanotube catalyst material is deposited on the first thermally conductive substrate in the nanotube growth areas by shadow masking, subtractive pattern and etch processes, or pattern and liftoff processing. In one embodiment, lithographic patterning may be employed for depositing the nanotube catalyst material, which includes fine area patterning within a catalyst bulk area to form islands of catalyst to control the density of the grown nanotubes. Examples of nanotube materials include nickel, cobalt, molybdenum, gold, iron, and combinations thereof. In certain embodiments, thermal processing of the nanotube catalyst material may be performed to tailor the nanotube catalyst properties to control the quality and density of the nanotubes. For example, the nanotube catalyst may be exposed to temperatures that are in excess of its melting point such that the hydrophobic nature of the catalyst causes it to form small random clusters of catalyst.

Moreover, the process 40 includes orienting the second thermally conductive substrate opposite the first thermally conductive substrate (block 48). The second thermally conductive substrate is oriented such that the patterned electrical barrier is disposed between the first and second thermally conductive substrates. In this embodiment, the second thermally conductive substrate comprises a non-catalytic surface. In certain embodiments, a plurality of vent holes are provided in the second thermally conductive substrate in positions that align with each nanotube growth area oriented within each of the plurality of closed shapes of the patterned electrical barrier on the first thermally conductive substrate. In one embodiment, the vent holes are laser drilled on the second thermally conductive substrate. Alternatively, the vent holes may be provided on the second thermally conductive substrate by reactive ion etching, wet etching, or mechanical milling.

Next, a precursor gas is provided proximate the nanotube catalyst material to facilitate growth of nanotubes in the nanotube growth areas from the first thermally conductive substrate toward, and limited by, the second thermally conductive substrate (block 50). In this embodiment, the self limiting growth of the nanotubes occurs due to inability to further diffuse gas to the tip of the nanotube as the distance of the tip of nanotube from the second thermally conductive substrate becomes less than the size of a gas molecule of the precursor gas. Examples of such precursor gas include methane, ethylene, and acetylene. In other words, the growth of the nanotubes is self-limited by the upper and lower boundaries of the first and second thermally conductive substrates, the surrounding boundaries of the patterned electrical barrier, the gas molecule size, and a processing temperature. In another embodiment, the nanotube growth rate and time may be controlled to control the gap width between the nanotube tip and the second thermally conductive substrate. In certain embodiments, the thermotunneling gap facilitates heat transfer between the first and second thermally conductive substrates on introduction of a flow of current between the first and second thermally conductive substrates.

Moreover, embodiments of the process 40 include bonding the first and second thermally conductive substrates in a wafer bonder. In certain embodiments, the first and second thermally conductive substrates are placed inside a vacuum chamber and are bonded at a desired temperature, thus forming a vacuum within the thermotunneling gap to enhance the efficiency of the thermal transfer device. Alternatively, the bonding of the first and second thermally conductive substrates may be performed in an inert gas environment, thus filling the thermotunneling gap with an inert gas such as xenon. The first and second thermally conductive substrates may be bonded in a configuration in which the first and second thermally conductive substrates are positioned opposite from one another.

In certain embodiments, a plurality of units having opposite sections of bonded first and second thermally conductive substrates are extracted to form a plurality of thermal transfer devices. Each of these extracted units has at least one closed shape of the patterned electrical barrier disposed about the nanotubes. The extracted units may be coupled electrically and assembled as a thermal transfer module to provide desired heating or cooling capacity based on certain thermal management needs.

Figure 5:
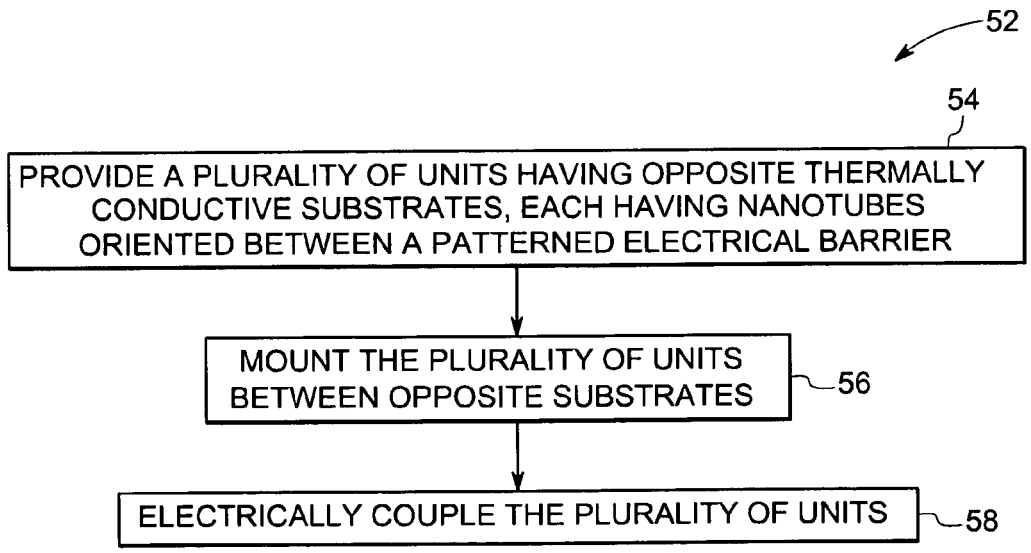
FIG. 5 is a flow chart illustrating a method of manufacturing a thermal transfer device having a plurality of units coupled together in accordance with another embodiment of the present technique.

Turning now to FIG. 5, a flow chart illustrates an alternate exemplary process 52 of manufacturing the thermal transfer devices of FIGS. 1, 2 and 3 in accordance with embodiments of the present technique. The process 52 begins by providing a plurality of units having opposite thermally conductive substrates (block 54). In this embodiment, each of the units comprises nanotubes oriented between a patterned electrical barrier to form a thermotunneling gap. In operation, each of the plurality of units facilitates thermotunneling of electrons between the opposite thermally conductive substrates. The thermally conductive substrates, with the nanotubes oriented between the patterned electrical barrier, function as electrodes for the transfer of electrons across the thermotunneling gap. Moreover, the plurality of units may be fabricated as explained above with reference to FIG. 4.

Next, at block 56, the plurality of units having the patterned electrical barrier is mounted between opposite substrates. Finally, the units are electrically coupled together (block 58). As assembled, the plurality of units cooperatively transfer heat via thermotunneling of electrons between the first and second thermally conductive substrates of each respective unit, thereby providing the desired cooling or heating of an object. In some embodiments, a low work function material may be disposed on a surface of each of the nanotubes for reducing the work function of the nanotubes. Examples of such low work function material include cesium, lithium, potassium, sodium and thin layers of doped wide band gap materials.

Figure 6:
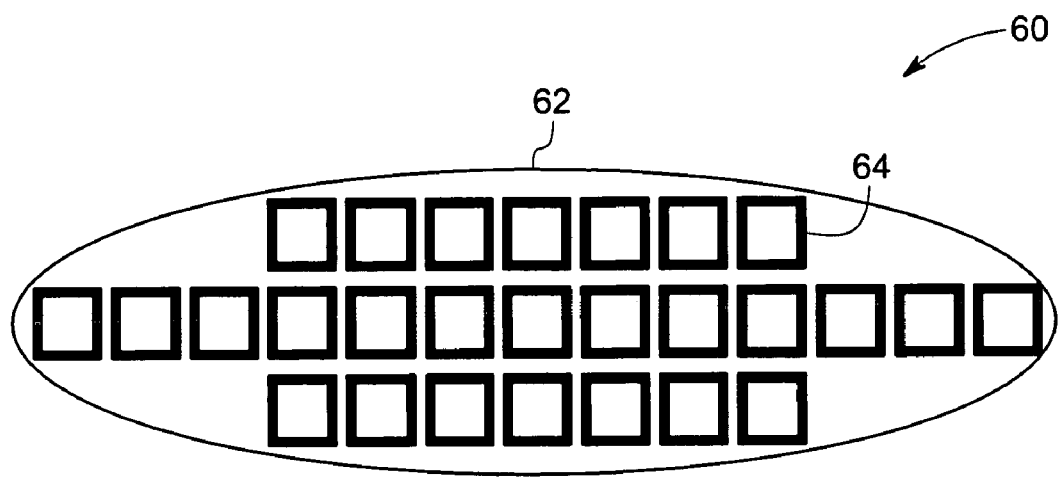
FIG. 6 is a diagrammatical top view illustrating a substrate having a patterned electrical barrier for use in a thermal transfer device in accordance with embodiments of the present technique.

FIGS. 6-11 illustrate components of the thermotunneling-based thermal transfer devices of FIGS. 1, 2, and 3 fabricated by the techniques described in FIGS. 4 and 5 in accordance with certain embodiments of the present technique. Referring now to FIG. 6, this figure illustrates an insulating patterned configuration or patterned electrical barrier 60 on a first thermally conductive substrate 62. In certain embodiments, the substrate 62 is a substantially atomically flat material, such as described in detail above. In certain embodiments, the first thermally conductive substrate 62 comprises a doped n-type silicon wafer, a doped p-type silicon wafer, or a highly polished thermally and electrically conductive metallic substrate. For example, an aluminum hard drive disc blank may be used as the first thermally conductive substrate 62. Further, the substrate 62 may comprise an electrically insulating substrate having an electrically conductive coating disposed on the electrically insulating substrate. The patterned electrical barrier 60 includes a plurality of open or closed shapes disposed on the first thermally conductive substrate 62. In this embodiment, the patterned electrical barrier 60 includes a plurality of insulative closed shapes 64 disposed on the first thermally conductive substrate 62. In the illustrated embodiment, the insulative closed shapes 64 are rectangular frames, borders, or windows. However, other shapes and configurations of the insulative closed shapes 64 are within the scope of the present technique.

The insulative closed shapes 64 comprise a material having a low thermal conductivity typically in the range of about 0.01 W/cm K to about 0.15 W/cm K. Examples of such materials include oxides, nitrides, polymers, and silica-based aerogels. In one embodiment, the insulative closed shapes 64 may be deposited on the substrate 62. In another embodiment, the insulative closed shapes 64 may be grown on the substrate 62. Further, the patterning of the insulative closed shapes 64 may be achieved by techniques such as etching, photoresist, shadow masking, lithography, and so forth.

Figure 7:
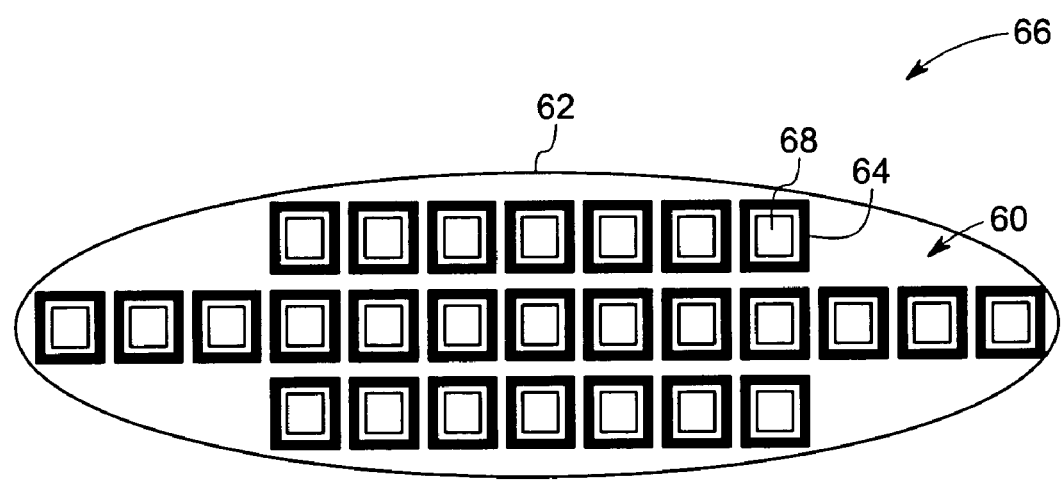
FIG. 7 is a diagrammatical top view illustrating a substrate having the patterned electrical barrier of FIG. 6 and a nanotube catalyst material disposed between the patterned electrical barrier for use in a thermal transfer device in accordance with embodiments of the present technique.

FIG. 7 illustrates an exemplary nanotube catalyst material pattern 66 in accordance with embodiments of the present technique. As illustrated, each of the insulative closed shapes 64 surrounds a nanotube growth area or nanotube catalyst material 68 on the first thermally conductive substrate 62. In other words, a similar pattern of nanotube catalyst material 68 is provided in alignment with the patterned electrical barrier 60, such that each portion of the nanotube catalyst material 68 is bounded by one of the respective insulative closed shapes 64. As illustrated, each portion of the nanotube catalyst material 68 has a rectangular shape adapted to the shape and confines of the respective insulative closed shape 64. Accordingly, modification to the shapes of the insulative closed shapes 64 will result in a variety of potential shapes of the portion of nanotube catalyst materials 68. Thus, other shapes are within the scope of the present technique.

In certain embodiments, the nanotube catalyst material 68 is disposed selectively on the substrate 62 by using techniques such as etching, photo resist, lithography, shadow masking, subtractive pattern and etch processes, pattern and liftoff processing and so forth. Examples of nanotube materials include nickel, cobalt, molybdenum, gold, iron, and combinations thereof. In this embodiment, the nanotube catalyst material 68 is deposited within the insulative closed shapes 64 to form nanotube growth areas for subsequent growth of nanotubes.

Figure 8:
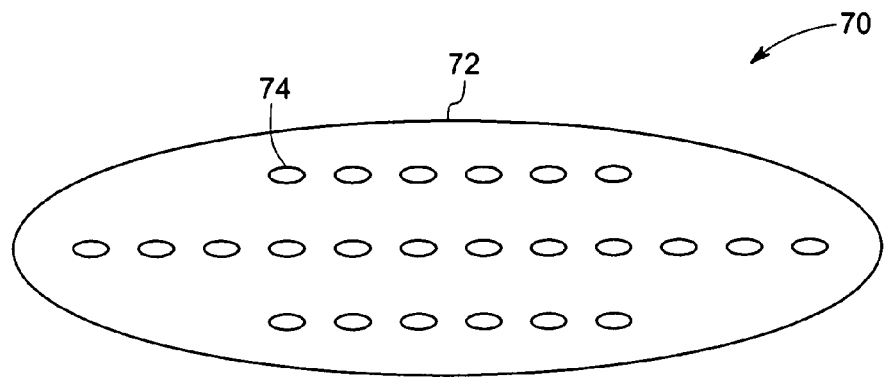
FIG. 8 is a diagrammatical top view illustrating a substrate having gaseous vent holes for assembly with the substrate of FIG. 7 for use in a thermal transfer device in accordance with embodiments of the present technique.

FIG. 8 illustrates an exemplary vent hole pattern 70 on a second thermally conductive substrate 72. In certain embodiments, the second thermally conductive substrate 72 is a substantially atomically flat material, such as described in detail above. In this embodiment, the substrate 72 comprises a thermally conductive substrate with a non-catalytic surface. In the illustrated embodiment, the second thermally conductive substrate 72 comprises gaseous vent holes 74. Each of the gaseous vent holes 74 is positioned for alignment at least partially within one of the nanotube growth areas of the first thermally conductive substrate 62 when the first and second thermally conductive substrates 62 and 72 are bonded together. In one embodiment, the gaseous vent holes 74 are laser drilled on the second thermally conductive substrate 72. Alternatively, the gaseous vent holes 74 may be provided on the second thermally conductive substrate 72 by reactive ion etching, wet etching, or mechanical milling.

Figure 9:
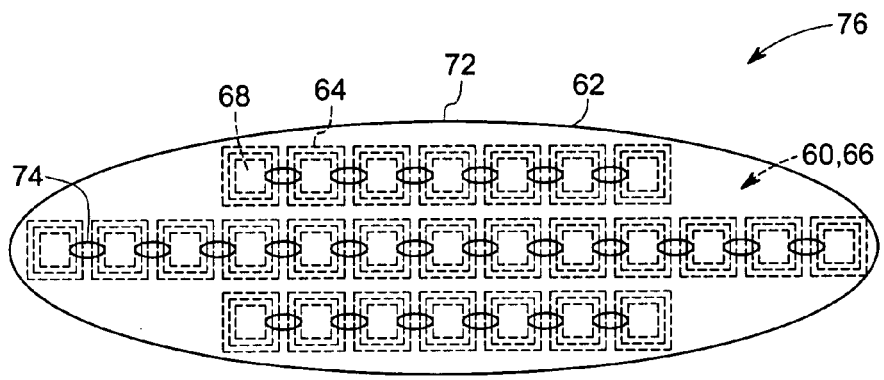
FIG. 9 is a diagrammatical top view illustrating an assembly having the patterned electrical barrier of FIG. 6, the nanotube catalyst material of FIG. 7, and the gaseous vent holes of FIG. 8 for use in a thermal transfer device in accordance with embodiments of the present technique.

The second thermally conductive substrate 72 is bonded to the first thermally conductive substrate 62 over the patterned electrical barrier 60 and nanotube catalyst material 68 to form a bonded assembly 76, as illustrated in FIG. 9. The bonded assembly 76 has the first and second thermally conductive substrates 62 and 72 bonded in a configuration where the first and second thermally conductive substrates 62 and 72 are positioned opposite one another. In this configuration, each of the gaseous vent holes 74 on the second thermally conductive substrate 72 align at least partially within one of the insulative closed shapes 64 surrounding the nanotube catalyst materials 68 on the first thermally conductive substrate 62. The bonded assembly 76 has a pattern of cavities corresponding to the space inside each insulative closed shape 64 of the patterned electrical barrier 60 between the bonded first and second thermally conductive substrates 62 and 72.

Following the bonding of the first and second thermally conductive substrates 62 and 72, a precursor gas may be introduced proximate the nanotube catalyst material 68 to facilitate the growth of nanotubes as illustrated below with reference to FIG. 10. In the illustrated embodiment, this precursor gas is injected or generally provided into the pattern of cavities through the gaseous vent holes 74. Examples of such precursor gas include methane, ethylene, and acetylene. After the nanotubes are grown the gaseous vent holes 74 are sealed preferably under vacuum by a suitable seal material, such as frit glass, or another substrate bonded over the second thermally conductive substrate 72.

FIG. 10 illustrates an exemplary assembly 78 having nanotubes 80 grown in a self-limiting manner between the first and second substrates 62 and 72 in the region of the nanotube catalyst material 68 within the closed shapes 64 of the patterned electrical barrier 60 in accordance with embodiments of the present technique. In this embodiment, the nanotubes are grown in the nanotube growth areas 68 and a grown dimension of the nanotubes 80 is limited by inability to further diffuse gas to the tip of the nanotube as its distance from the second thermally conductive substrate 72 becomes less than the size of the gas molecule of the precursor gas. The gap distance between the nanotubes 80 and the second thermally conductive substrate 72 may be adjusted depending on the gas molecule size and processing temperature. In one embodiment, the nanotube growth rate and time may be controlled to control the gap to the desired width between the nanotube and the upper electrode. In the bonded assembly 78, the nanotubes 80 oriented within the closed shapes 64 of the patterned electrical barrier 60 define a thermotunneling gap, as discussed in further detail below. In this embodiment, a grown dimension of the nanotubes 80 between the first and second substrates 62 and 72 forms the thermotunneling gap. In certain embodiments, a low work function material may be disposed at least partially about the grown nanotubes 80 to reduce the low work function of the nanotubes 80. Examples of such low work function material include cesium, lithium, potassium, and sodium. In certain embodiments, the low work function material may be incorporated during a sealing process by first evacuating the assembly 78 in a vacuum chamber and then back bleeding the low work function material from a gaseous or vapor state into the vacuum chamber. In this embodiment, the low work function material may be disposed about the nanotubes 80 at a temperature lower than that of the sealing process temperature. Following the coating of the low work function material, additional evacuation may be performed to reach a desired vacuum level. Further the temperature is brought above the melt point temperature, or bonding temperature, for completing the sealing process.

Referring now to FIG. 11, an exemplary assembly 82 having another substrate 84 disposed sealingly over the gaseous vent holes 74 is illustrated. In this embodiment, the substrate 84 comprises a doped substrate that is configured to seal the gaseous vent holes 74. In certain embodiments, a sealing material may be used to seal the gaseous vent holes 74. Examples of such sealing materials include frit glass and an oxide. The bonded assembly 82 is then cut into separate units based on the patterned electrical barrier 60. For example, the bonded structure may be cut in the region surrounding each of the insulative closed shapes 64. The separation of individual units from the bonded assembly may be achieved by using techniques such as diamond blade wafer dicing or laser separation. Referring now to FIG. 12, this figure illustrates a top view of an exemplary unit 86 extracted from the assembly 82 of FIG. 11 in accordance with embodiments of present technique. As illustrated, the extracted unit 86 comprises a single closed shape 64 of the patterned electrical barrier 60 disposed about the nanotubes 80, which grew in a self-limiting manner between the first and second thermally conductive substrates 62 and 72.

FIG. 13 illustrates a cross-sectional side view of an exemplary embodiment of the extracted units 86 of FIG. 12 representing a thermal transfer device, e.g., a thermotunneling device 88, which is applicable to a variety of heating and cooling systems. For example, each of the extracted units 86 may be employed as the thermotunneling devices illustrated in FIGS. 1-3. As illustrated, the extracted unit 86 or thermotunneling device 88 includes the first thermally conductive substrate 62 and the opposite second thermally conductive substrate 72. The thermotunneling device 88 also includes one of the insulative closed shapes 64 of the patterned electrical barrier 60 disposed about the nanotubes 80. As discussed above, a grown dimension of the nanotubes 80 generally defines a thermotunneling gap 90 between the lower and upper thermally conductive substrates 62 and 72, respectively. In this embodiment, the distance between the tip of nanotubes 80 and the second thermally conductive substrate 72 defines the thermotunneling gap 90. In addition, the gaseous vent hole 74 in the second thermally conductive substrate 72 is sealed by the substrate 84, which has been wafer bonded over the substrate 72. The illustrated thermotunneling device 88 also includes a coating material 91 disposed over the nanotubes 80 to reduce the work function of the nanotubes 80 in the thermotunneling gap 90 between the adjacent substrates 62 and 72. For example, this coating material 91 may be injected through the gaseous vent hole 74 after growing the nanotubes 80 and subsequently evacuating the precursor gas. Embodiments of the coating material include cesium, lithium, potassium, and sodium. In turn, the gaseous vent hole 74 is sealed by a seal material and/or the additional substrate 84. As discussed in detail above, the thermotunneling device 88 may be manufactured using a variety of materials and manufacturing techniques.

FIG. 14 illustrates a cross-sectional side view of a thermal transfer device or an assembled module 92 having a plurality of thermotunneling devices 88 in accordance with embodiments of the present technique. In the illustrated embodiment, the extracted units 86 or thermotunneling devices 88 are mounted between opposite substrates 94 and 96 and are electrically coupled to create the assembled module 92. In this manner, the thermotunneling devices 88 cooperatively provide a desired heating or cooling capacity, which can be used to transfer heat from one object or area to another. In certain embodiments, the plurality of thermotunneling devices 88 may be coupled via a conductive adhesive, such as silver filled epoxy or a solder alloy. The conductive adhesive or the solder alloy for coupling the plurality of thermotunneling devices 88 may be selected based upon a desired processing technique and a desired operating temperature of the thermal transfer device. Finally, the assembled module 92 is coupled to an input voltage source via leads 98 and 100. In operation, the input voltage source provides a flow of current through the thermotunneling devices 88, thereby creating a tunneling flow of electrons across the thermotunneling gap 90 between the substrates 62 and 72. As a result of this tunneling flow of electrons, the thermotunneling devices 88 facilitate heat transfer between the substrates 94 and 96.

FIG. 15 illustrates a perspective view of a thermal transfer module 102 having an array of thermotunneling devices 88 in accordance with embodiments of the present technique. In this embodiment, the thermotunneling devices 88 are employed in a two-dimension array to meet a thermal management need of an environment or application. The thermotunneling devices 88 may be assembled into the heat transfer module 102, where the devices 88 are coupled electrically in series and thermally in parallel to enable the flow of electrons from first object 14 in the module 98 to the second object 16 in the module 102, thus transferring the heat from the first object 14 to the second object 16.

The various aspects of the techniques described above find utility in a variety of heating/cooling systems, such as refrigeration, air conditioning, electronics cooling, industrial temperature control, power generation, and so forth. These include air conditioners, water coolers, refrigerators, heat sinks, climate control seats, and so forth. The thermal transfer devices as described above may be employed in refrigeration systems such as for household refrigeration and industrial refrigeration. In addition, such thermal transfer devices may be employed for cryogenic refrigeration, such as for liquefied natural gas (LNG) or superconducting devices. Further, the thermal transfer device may be employed in systems for ventilation and air conditioning. Examples of such systems include air conditioners and dehumidifiers. In addition, the thermal transfer devices may be employed for power generation and/or waste heat recovery in different applications by maintaining a thermal gradient between two electrodes. Examples of such applications include gas turbine exhausts, furnace exhausts, exhausts of vehicles, and so forth.

The passive thermal transfer device described above may also be employed for thermal energy conversion and for thermal management. It should be noted that the materials and the manufacturing techniques for the thermal transfer device may be selected based upon a desired thermal management need of an object. Such devices may be used for cooling of microelectronic systems such as microprocessor and integrated circuits. Further, the thermal transfer devices may be employed for thermal management of semiconductors, photonic devices, and infrared sensors. As noted above, the method described here may be advantageous in relatively precise control of the spacing and alignment between adjacent electrodes of a thermal transfer device to meet the desired thermal management needs in the environments mentioned above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of manufacturing a thermal transfer device, comprising:
providing first and second thermally conductive substrates that are substantially atomically flat;
providing a patterned electrical barrier having a plurality of closed shapes on the first thermally conductive substrate;
providing a nanotube catalyst material on the first thermally conductive substrate in a nanotube growth area oriented within each of the plurality of closed shapes of the patterned electrical barrier;
orienting the second thermally conductive substrate opposite the first thermally conductive substrate such that the patterned electrical barrier is disposed between the first and second thermally conductive substrates; and
providing a precursor gas proximate the nanotube catalyst material to facilitate growth of nanotubes in the nanotube growth areas from the first thermally conductive substrate toward, and limited by, the second thermally conductive substrate, wherein introduction of current flow between the first and second thermally conductive substrates enables heat transfer between the first and second thermally conductive substrates via a flow of electrons between the first and second thermally conductive substrates.

2. The method of claim 1, wherein height of nanotubes is controlled by controlling a growth rate and time of the growth of the nanotubes to achieve a desired thermotunneling gap.

3. The method of claim 1, further comprising providing a plurality of vent holes in the second thermally conductive substrate in positions that align with each nanotube growth area oriented within each of the plurality of closed shapes of the patterned electrical barrier on the first thermally conductive substrate.

4. The method of claim 3, further comprising sealing the plurality of vent holes in a vacuum or an inert gas environment.

5. The method of claim 1, further comprising bonding, in a vacuum environment, the first and second thermally conductive substrates in a configuration in which the first and second thermally conductive substrates are positioned opposite from one another.

6. The method of claim 1, wherein providing the patterned electrical barrier comprises growing or depositing an electrical barrier layer on the first thermally conductive substrate, through plasma enhanced chemical vapor deposition (PECVD), or sputtering, or thermal oxidation, or any combination thereof.

7. The method of claim 1, further comprising disposing a low work function material on a surface of each of the nanotubes for reducing the work function of the nanotubes.

8. A method of manufacturing a thermal transfer device, comprising:
providing first and second thermally conductive substrates positioned opposite one another about nanotubes oriented between a patterned electrical barrier, wherein a grown dimension of the nanotubes is limited by space between the first and second thermally conductive substrates, wherein introduction of current flow between the first and second thermally conductive substrates enables heat transfer between the first and second thermally conductive substrates via a flow of electrons between the first and second thermally conductive substrates.

9. The method of claim 8, further comprising extracting a unit having opposite sections of the first and second thermally conductive substrates, the unit having a portion of the patterned electrical barrier disposed about the nanotubes, the portion defining a thermotunneling gap between the first and second thermally conductive substrates.

10. The method of claim 8, further comprising disposing a low work function material on a surface of each of the nanotubes for reducing the work function of the nanotubes.

11. A thermal transfer device, comprising:
first and second thermally conductive substrates that are positioned opposite from one another, wherein the first and second thermally conductive substrates are each substantially atomically flat;
a patterned electrical barrier having a plurality of closed shapes disposed on the first thermally conductive substrate; and
a plurality of nanotubes grown in a nanotube growth area oriented within each of the plurality of closed shapes of the patterned electrical barrier, wherein a grown dimension of the nanotubes is limited by growth areas from the first thermally conductive substrate toward, and limited by, the second thermally conductive substrate, wherein a thermotunneling gap is defined as a distance between a tip of the nanotubes and the second thermally conductive substrate and wherein introduction of current flow between the first and second thermally conductive substrates enables heat transfer between the first and second thermally conductive substrates via a flow of electrons across the thermotunneling gap between the first and second thermally conductive substrates.

12. The device of claim 11, wherein the first or second thermally conductive substrate comprises a doped n-type silicon wafer.

13. The device of claim 11, wherein the patterned electrical barrier comprises an oxide, or a nitride, or a silica-based aerogel, or a polymer, or any combination thereof.

14. The device of claim 11, further comprising a nanotube catalyst material disposed on the first thermally conductive substrate in the nanotube growth area.

15. The device of claim 14, further comprising a precursor gas proximate the nanotube catalyst material to facilitate the growth of nanotubes in the nanotube growth areas.

16. The device of claim 11, wherein the second thermally conductive substrate comprises a plurality of vent holes, each aligned at least partially within one of the nanotube growth areas, the plurality of vent holes being sealed after growth of the plurality of nanotubes.

17. The device of claim 11, wherein the thermal transfer device is configured to generate power by maintaining a temperature gradient between the first and second thermally conductive substrates.

18. The device of claim 11, wherein the thermal transfer device is configured to provide cooling for a refrigeration system or an air conditioning system.

19. The device of claim 11, wherein the thermal transfer device is configured for thermal energy conversion.

20. The device of claim 11, wherein the thermal transfer device is configured to provide cooling for a microelectronic system.

21. A method of operation of a thermal transfer device, comprising:
passing hot electrons across a thermotunneling gap between first and second thermally conductive substrates having nanotubes oriented between a patterned electrical barrier on the first or second thermally conductive substrate, wherein the thermotunneling gap is defined as a distance between a tip of the nanotubes and the second thermally conductive substrate.

22. A thermal transfer device, comprising:
first and second thermally conductive substrates that are positioned opposite from one another, wherein the first and second thermally conductive substrates are each substantially atomically flat;
a patterned electrical barrier disposed on the first thermally conductive substrate; and
a plurality of nanotubes grown in a nanotube growth area of the patterned electrical barrier, wherein a grown dimension of the nanotubes is limited by growth areas from the first thermally conductive substrate toward, and limited by, the second thermally conductive substrate and wherein a thermotunneling gap is defined as a distance between a tip of the nanotubes and the second thermally conductive substrate.

* * * * *